(12) United States Patent
Tamura et al.

(10) Patent No.: US 7,547,629 B2
(45) Date of Patent: Jun. 16, 2009

(54) FERROELECTRIC CAPACITOR AND ITS MANUFACTURING METHOD AND FERROELECTRIC MEMORY DEVICE

(75) Inventors: Hiroaki Tamura, Suwa (JP); Hiroyuki Mitsui, Suwa (JP); Tatsuo Sawasaki, Fujimi (JP)

(73) Assignee: Seiko Epson Corporation (JP)

( * ) Notice: Subject to any disclaimer, the term of this patent is extended or adjusted under 35 U.S.C. 154(b) by 324 days.

(21) Appl. No.: 11/459,742

(22) Filed: Jul. 25, 2006

(65) Prior Publication Data

US 2007/0029594 A1 Feb. 8, 2007

(30) Foreign Application Priority Data

Aug. 3, 2005 (JP) ............................. 2005-225482

(51) Int. Cl.
*H01L 21/44* (2006.01)
*H01L 29/004* (2006.01)

(52) U.S. Cl. ........................ 438/653; 257/71; 257/295

(58) Field of Classification Search ................ 438/3, 438/253, 396, 785, 653; 257/295, 363, 71
See application file for complete search history.

(56) References Cited

U.S. PATENT DOCUMENTS

| 6,342,425 | B1 * | 1/2002 | Joo ........................... 438/396 |
| 7,176,132 | B2 | 2/2007 | Sashida et al. |
| 7,180,141 | B2 * | 2/2007 | Eliason et al. ............ 257/363 |
| 2007/0040198 | A1 * | 2/2007 | Matsuura ................... 259/296 |

FOREIGN PATENT DOCUMENTS

| JP | 09-252094 | 9/1997 |
| JP | 10-056140 | 2/1998 |
| JP | 10-214944 | 8/1998 |
| JP | 2000-277701 | 10/2000 |
| JP | 2004-153031 | 5/2004 |
| JP | 2004-186517 | 7/2004 |

* cited by examiner

*Primary Examiner*—Calvin Lee
(74) *Attorney, Agent, or Firm*—Harness, Dickey & Pierce, P.L.C.

(57) ABSTRACT

A method for manufacturing a ferroelectric capacitor includes steps of: (a) forming a first crystalline barrier layer; (b) forming a second crystalline barrier layer composed of nitride by nitriding the first crystalline barrier layer; (c) forming a first electrode above the second crystalline barrier layer; (d) forming a ferroelectric film on the first electrode; and (e) forming a second electrode on the ferroelectric film.

6 Claims, 4 Drawing Sheets

FERROELECTRIC CAPACITOR AND ITS MANUFACTURING METHOD AND FERROELECTRIC MEMORY DEVICE

The entire disclosure of Japanese Patent Application No. 2005-225482, filed on Aug. 3, 2005 is expressly incorporated by reference herein.

BACKGROUND

1. Technical Field

The present invention relates to ferroelectric capacitors, methods for manufacturing ferroelectric capacitors, and ferroelectric memory devices.

2. Related Art

A ferroelectric memory device (FeRAM) is a nonvolatile memory that is capable of high-speed operation at low voltages, and its memory cell can be composed with one transistor and one capacitor (1T/1C). Accordingly, ferroelectric memory devices can be integrated to the level of integration of DRAMs, and therefore are highly expected as large-capacity nonvolatile memories.

In order to make a ferroelectric capacitor that composes a ferroelectric memory device to achieve the best ferroelectric characteristics, the crystalline orientation of each of the layers that compose the ferroelectric capacitor is extremely important. In this connection, an example of related art is described in Japanese laid-open patent application JP-A-2000-277701.

SUMMARY

In accordance with an advantage of some aspects of the present invention, it is possible to provide a ferroelectric capacitor composed of multiple layers in which the crystalline orientation of each of the layers composing the ferroelectric capacitor is well controlled. In accordance with another advantage of some aspects of the present invention, it is possible to provide a method for manufacturing such a ferroelectric capacitor as described above, and a ferroelectric memory device that uses the ferroelectric capacitor.

A method for manufacturing a ferroelectric capacitor in accordance with an embodiment of the invention includes the steps of: (a) forming a first crystalline barrier layer; (b) forming a second crystalline barrier layer composed of nitride by nitriding the first crystalline barrier layer; (c) forming a first electrode above the second crystalline barrier layer; (d) forming a ferroelectric film on the first electrode; and (e) forming a second electrode on the ferroelectric film.

According to the method for manufacturing a ferroelectric capacitor in accordance with the embodiment of the invention, a first crystalline barrier layer is nitrided to form a second crystalline barrier layer composed of nitride, such that the second barrier layer that does not reflect the crystalline structure of a lower layer can be obtained. Furthermore, a first electrode and a ferroelectric film are formed on the second barrier layer, whereby the first electrode and the ferroelectric film that reflect the crystalline structure of the second barrier layer can be formed, and the first electrode that does not reflect the crystalline structure of the lower layer can be provided. In other words, by forming the second barrier layer having a specified crystalline orientation, the ferroelectric film having a desired crystalline orientation can be formed. By this, the ferroelectric capacitor that excels in hysteresis characteristics can be obtained.

In the method for manufacturing a ferroelectric capacitor described above in accordance with an aspect of the embodiment of the invention, in the step (a), the first barrier layer may be formed on a plug.

In the method for manufacturing a ferroelectric capacitor described above in accordance with an aspect of the embodiment of the invention, in the step (b), the first barrier layer may be annealed in an atmosphere containing nitrogen, thereby nitriding the first barrier layer.

In the method for manufacturing a ferroelectric capacitor described above in accordance with an aspect of the embodiment of the invention, in the step (b), the annealing may be conducted between about 350° C. and about 650° C.

In the method for manufacturing a ferroelectric capacitor described above in accordance with an aspect of the embodiment of the invention, the first barrier layer may include titanium and aluminum, and the second barrier layer may be nitride of titanium and aluminum. The materials described above have an oxygen barrier property and therefore are suitable as the barrier layers described above. In this case, the first barrier layer may contain, as its constituent element, titanium by 70 atom % or more. Also, in this case, prior to the step (a), the method may further include the step of exciting plasma of ammonia gas and irradiating the plasma to a surface of the layer on which the first barrier layer is to be formed.

A ferroelectric capacitor in accordance with another embodiment of the invention includes a first electrode provided on a crystalline barrier layer composed of nitride, a ferroelectric film provided on the first electrode, and a second electrode provided on the ferroelectric film.

The ferroelectric capacitor in accordance with the embodiment of the invention includes a second barrier layer with a specified crystalline orientation, and a ferroelectric film having a desired crystalline orientation. As a result, the ferroelectric capacitor excels in hysteresis characteristics.

In the ferroelectric capacitor in accordance with an aspect of the embodiment of the invention, the barrier layer may contain, as a constituent element, at least one of titanium, aluminum and tantalum.

In the ferroelectric capacitor in accordance with an aspect of the embodiment of the invention, the barrier layer may be nitride of titanium and ammonium. In this case, the composition of the barrier layer may be defined as $Ti_{(1-x)}Al_xN_y$ (where x is in a range of $0 \leq x \leq 30$, and y is greater than 0 ($0<y$)).

A ferroelectric memory device in accordance with still another embodiment of the invention includes a switching transistor, a plug that is electrically connected to the switching transistor, and the ferroelectric capacitor in accordance with an aspect of the embodiment of the invention described above provided on the plug.

Because the ferroelectric memory device in accordance with the embodiment of the invention includes the ferroelectric capacitor in accordance with an aspect of the embodiment of the invention provided on the plug described above, the first electrode that reflects the crystalline structure of the barrier layer is provided. Accordingly, the ferroelectric film with an excellent crystalline orientation is provided on the first electrode, such that the ferroelectric capacitor excels in hysteresis characteristics.

DESCRIPTION OF EXEMPLARY EMBODIMENTS

Preferred embodiments of the invention are described below with reference to the accompanying drawings.

1. Ferroelectric Memory Device

Figure 1:
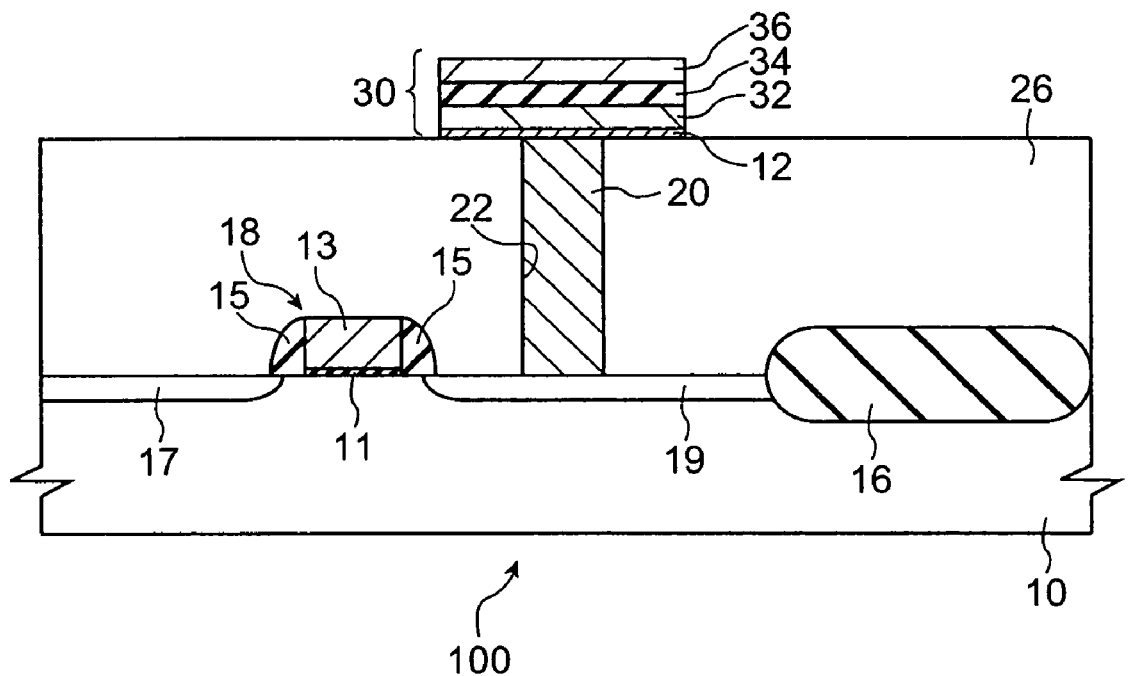
FIG. 1 schematically shows a cross-sectional view of a ferroelectric memory device in accordance with an embodiment of the invention.

FIG. 1 schematically shows a cross-sectional view of a ferroelectric memory device 100 in accordance with an embodiment of the invention. As shown in FIG. 1, the ferroelectric memory device 100 includes a ferroelectric capacitor 30, a plug 20, and a switching transistor 18 for the ferroelectric capacitor 30. It is noted that, although the present embodiment is described referring to a 1T/1C type memory cell, the applicability of the invention is not limited to a 1T/1C type memory cell.

The transistor 18 includes a gate dielectric layer 11, a gate conductive layer 13 provided on the gate dielectric layer 11, and first and second impurity regions 17 and 19 that define source/drain regions. Also, the plug 20 is electrically connected to the switching transistor 18.

The ferroelectric capacitor 30 includes a first electrode 32 that is provided above a crystalline barrier layer 12 composed of nitride, a ferroelectric film 34 provided on the first electrode 32, and a second electrode 36 provided on the ferroelectric film 34.

Also, the ferroelectric capacitor 30 is provided on the plug 20 that is provided in a dielectric layer 26. The plug 20 is formed on the second impurity region 19. The dielectric layer 26 has an opening section 24, and the plug 20 includes a conductive layer 22 provided in the opening section 24. The conductive layer 22 is composed of a high melting point metal, such as, tungsten, molybdenum, tantalum, titanium, nickel or the like, and may preferably be composed of tungsten.

The barrier layer 12 has at least a portion provided on the plug 20. The barrier layer 12 is composed of crystalline nitride having an oxygen barrier property. The barrier layer 12 may preferably include, as its constituent element, at least one of titanium, aluminum and tantalum. As a constituent material of the barrier layer 12, for example, TiAlN, TiN and TaN can be enumerated. Preferably, the constituent material of the barrier layer 12 may be a nitride of titanium and aluminum (TiAlN). When the barrier layer 12 is composed of TiAlN, more preferably, the composition (atom ratio) of titanium, aluminum and nitrogen in the barrier layer 12 may be expressed as $Ti_{(1-x)}Al_xN_y$ (where x is in a range of $0 \leq x \leq 30$, and y is greater than 0 ($0<y$)). In this case, the barrier layer 12 that exhibits a high level of self-orientation property and excels in oxidation resisting property can be provided. Also, when the barrier layer 12 is composed of TiAlN, the crystalline orientation of the barrier layer 12 may preferably be a (111) orientation.

Also, the barrier layer 12 may preferably have a film thickness of at least 20 nm in order not to be affected from the crystal structure of the underlying layer, and may preferably be, for example, 100-200 nm.

The first electrode 32 may be composed of at least one kind of metal selected from platinum, ruthenium, rhodium, palladium, osmium and iridium, may preferably be composed of platinum or iridium, and may more preferably be composed of iridium. Also, the first electrode 32 may be composed of a single layer film, or a multilayer film of laminated layers. When at least a portion of the first electrode 32a is crystalline, the crystalline orientation of the crystalline portion may preferably be equal to the crystalline orientation of the barrier layer 12. In this case, the crystalline orientation of the ferroelectric film 34 may preferably be equal to the crystalline orientation of the crystalline portion of the first electrode 32a. For example, when the barrier layer 12 is composed of TiAlN, and the barrier layer 12 has a crystalline orientation that is in a (111) orientation, at least a portion of the first electrode 32 may preferably be crystalline, and its crystalline orientation may preferably be in a (111) orientation. According to this structure, when the ferroelectric film 34 is formed on the first electrode 32, the crystalline orientation of the ferroelectric film 34 can be readily made in a (111) orientation.

The ferroelectric film 34 includes a ferroelectric material. The ferroelectric material has a perovskite crystalline structure and may be expressed by a general formula of $A_{1-b}B_{1-a}X_aO_3$. The element A includes Pb. The element B is composed of at least one of Zr and Ti. The element X may be composed of at least one of V, Nb, Ta, Cr, Mo and W. As a ferroelectric material included in the ferroelectric film 34, a known material that can be used as a ferroelectric film, such as, for example, $(Pb(Zr,Ti)O_3)$ (PZT), $SrBi_2Ta_2O_9$ (SBT), and $(Bi,La)_4Ti_3O_{12}$ (BLT) can be used.

Among the materials listed above, PZT is suitable as the material of the ferroelectric film 34. In this case, the first electrode 32 may preferably be composed of iridium from the viewpoint of the device reliability.

When PZT is used as the material of the ferroelectric film 34, the content of titanium in the PZT may preferably be greater than the content of zirconium in order to obtain a greater amount of spontaneous polarization. The PZT with such a composition belongs to tetragonal crystal, and its spontaneous polarization axis is c-axis. However, because an a-axis orientation component that is orthogonal to c-axis concurrently exists therein, and the a-axis orientation component does not contribute to polarization reversal when the film is c-axis oriented, the ferroelectric characteristics may be harmed. In this case, by making the crystalline orientation of PZT used in the ferroelectric film 34 in a (III) orientation, the a-axis orientation component can be made to contribute to polarization reversal. Accordingly, when the ferroelectric film 34 is composed of PZT, and the content of titanium in the PZT is greater than the content of zirconium therein, the crystalline orientation of the PZT is preferably be in a (111) orientation, in view of the fact that the hysteresis characteristic of the PZT is excellent.

The second electrode 36 may be composed of any of the materials described above as an example of the material that can be used as the first electrode 32, or may be composed of aluminum, silver, nickel or the like. Also, the second electrode 36 may be in a single layer film, or a multilayer film of laminated layers. The second electrode 36 may preferably be composed of platinum or a laminated film of layers of iridium oxide and iridium.

The ferroelectric capacitor 30 in accordance with the embodiment of the invention includes the crystalline barrier layer 12 with a specified crystalline orientation, and the ferroelectric film 34 with a desired crystalline orientation. As a result, the ferroelectric capacitor 30 in accordance with the embodiment excels in hysteresis characteristics. In other words, in the ferroelectric capacitor 30 in accordance with the embodiment of the invention, because the first electrode 32 is provided on the crystalline barrier layer 12, the crystalline orientation property of the first electrode 32 can be increased. As a result, the ferroelectric film 34 with excellent crystalline orientation property can be formed on the first electrode 32, such that the ferroelectric capacitor 30 excels in hysteresis characteristics.

In particular, as described above, when the ferroelectric film 34 is composed of PZT, and the content of titanium in the PZT is greater than the content of zirconium, the crystalline orientation of the PZT may preferably be in a (111) orientation, in view of the fact that the PZT has favorable hysteresis characteristics. According to the ferroelectric capacitor 30 in accordance with the embodiment of the invention, because the barrier layer 12 whose crystalline orientation is in a (111) orientation is provided on the plug 20, the crystalline orientation of the first electrode 32 and the ferroelectric film 34 can be readily made in a (111) orientation. Because of the reasons described above, the ferroelectric capacitor 30 in accordance with the embodiment of the invention excels in hysteresis characteristics.

Also, in the ferroelectric capacitor 30 in accordance with the embodiment of the invention, the crystalline barrier layer 12 exists without reflecting the crystalline structure of the conductive layer 22 that is composed of tungsten (for example, when the barrier layer 12 is composed of crystalline TiAlN, the barrier layer 12 exists in a state being oriented in a (111) orientation), and the first electrode 32 is provided over the plug 20 through the barrier layer 12, whereby the first electrode 32 that does not reflect the crystalline structure of the lower layer (i.e., the plug 20) can be provided. In other words, the ferroelectric capacitor 30 in accordance with the embodiment of the invention is provided over the plug 20, but the crystalline structure of the underlying layer (i.e., the plug 20) is not reflected in the first electrode 32.

Let us assume a case in which the first electrode 32 of the ferroelectric capacitor 30 is directly disposed on the conductive layer 22 of the plug 20. In this case, when the conductive layer 22 is composed of a material having a high degree of crystallinity, the crystalline orientation of the conductive layer 20 might affect the crystalline orientation of the first electrode 32. For example, when the conductive layer 22 of the plug 20 is composed of tungsten, and if the first electrode 32 is directly provided on the conductive layer 22 composed of tungsten, because tungsten has a high degree of crystallinity, the crystalline structure of the conductive layer 22 affects the crystalline structure of the first electrode 32, which makes it difficult to provide the first electrode 32 with a desired crystalline structure. Furthermore, because the ferroelectric film 34 is provided on the first electrode 32 in this case, the crystalline orientation of the first electrode 32 might affect the crystalline orientation of the ferroelectric film 34. In this case, because the crystalline orientation of the ferroelectric film 34 that reflects the crystalline orientation of the first electrode 32 causes polarization in an undesired orientation, there is a possibility that the hysteresis characteristics of the ferroelectric capacitor 30 might be deteriorated.

In contrast, according to the ferroelectric capacitor 30 in accordance with the embodiment of the invention, the crystalline barrier layer 12 composed of nitride is provided on the conductive layer 22 of the plug 20, such that the crystalline orientation of the conductive layer 22 of the plug 20 can be prevented from reflecting the crystalline orientation of the first electrode 32 and the ferroelectric film 34. As a result, the ferroelectric capacitor 30 with excellent hysteresis characteristic can be obtained.

When the cross-sectional area of the plug 20 is constant, it is noted that the smaller the plane area of the ferroelectric capacitor 30, the smaller the rate of the plane area of the ferroelectric capacitor 30 to the cross-sectional area of the plug 20 becomes, and the problem concerning crystalline orientation, which is originated from the crystalline orientation of the conductive layer 22 of the plug 20 and impacts the ferroelectric film 34 through the first electrode 32, becomes more serious. Therefore, the ferroelectric capacitor 30 in accordance with the embodiment of the invention is useful, because the structure of the ferroelectric capacitor 30 can prevent deterioration of the hysteresis characteristics for the reasons described above, even when the device is miniaturized.

2. Method For Manufacturing Ferroelectric Memory Device

Next, a method for manufacturing a ferroelectric memory device 100 shown in FIG. 1 is described with reference to the accompanying drawings. FIGS. 2A through 2F are cross-sectional views schematically showing steps of a process for manufacturing a ferroelectric capacitor 30 included in the ferroelectric memory device 100 shown in FIG. 1. It is noted that FIGS. 2A through 2F show only an area adjacent to a dielectric layer 26 and a plug 20.

First, a transistor 18 and a plug 20 are formed (see FIG. 1). More concretely, the transistor 18 is formed on a semiconductor substrate 10, and then a dielectric layer 26 is laminated over the transistor 18. Next, an opening section 24 is formed in the dielectric layer 26, and the opening section 24 is embedded with a conductive layer 22, thereby forming the plug 20. The conductive layer 22 may be embedded by, for example, a CVD method or a sputter method.

Next, a ferroelectric capacitor 30 is formed. The method for manufacturing the ferroelectric capacitor 30 in accordance with an embodiment of the invention includes the steps of: (a) forming a first crystalline barrier layer 14a; (b) nitriding the first barrier layer 14a to form a second crystalline barrier layer 12a composed of nitride; (c) forming a first electrode 32a above the second barrier layer 12a; (d) forming a ferroelectric film 34a on the first electrode 32a; and (e) forming a second electrode 36a on the ferroelectric film 34a.

Figure 2A:
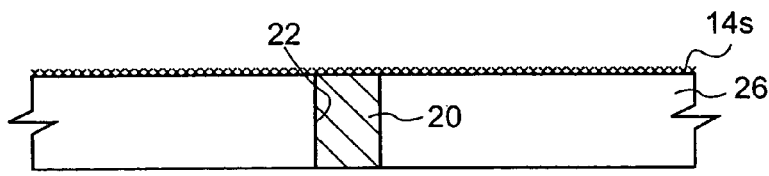
FIGS. 2A-2F are cross-sectional views schematically showing steps of a method for manufacturing a ferroelectric capacitor included in the ferroelectric memory device shown in FIG. 1.

First, before the first barrier layer 14a is formed, plasma of ammonia gas may be excited, and the plasma may be irradiated to a surface 14s of a layer on which the first barrier layer 14a is to be formed, if necessary, as shown in FIG. 2A. By the ammonia plasma treatment, the surface 14s is terminated with —NH, whereby atoms composing the first barrier layer 14a can readily migrate on the surface 14s when the first barrier layer 14a is formed in a later step to be described below. As a result, it is assumed that the constituent atoms of the first barrier layer 14a are promoted to become regularly arranged (in a close-packed state in this case) due to their self orientation property, such that the first barrier layer 14a with excellent crystalline orientation property can be formed.

Figure 2B:
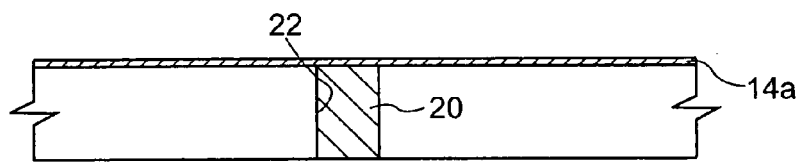

Next, as shown in FIG. 2B, a first crystalline barrier layer 14a is formed over the dielectric layer 26 and the plug 20. The first barrier layer 14a may be formed by any one of suitable film forming methods selected according to the material of the first barrier layer 14a, and may be formed by, for example, a sputter method or a CVD method. Also, the substrate temperature at which the first barrier layer 14a is formed can be appropriately selected according to the material.

For example, when the first barrier layer 14a is formed with nitride of titanium and aluminum, the first barrier layer 14a may be formed by a sputter method in an inert gas atmosphere (for example, argon). In this case, in order to provide a (111) orientation, the substrate temperature at which the first barrier layer 14a is formed may preferably be set between room temperature and 400° C., more preferably between 100° C. and 400° C., and even more preferably between 100° C. and 300° C. Also, when the first barrier layer 14a contains titanium and aluminum, the first barrier layer 14a may preferably contain as its constituent element titanium by 70 atom % or more, and more preferably contain titanium by 70-90 atom % and aluminum by 30-10 atom %. When the first barrier layer 14a contains titanium by 70 atom % or more, a second barrier layer 12a having a (111) orientation can be obtained in a nitriding step to be described below. The reason why the second barrier layer 12a having a (111) orientation can be obtained is assumed to be as follows. When the first barrier layer 14a contains titanium by 70 atom % or more, TiAl that composes the first barrier layer 14a strongly exhibits its self-orientation property, and thus has a (001) orientation. For this reason, in a nitriding step to be described below, nitrogen atoms enter gaps in TiAl of the first barrier layer 14a having a (001) orientation, whereby the second barrier layer 12a with a (111) orientation can be obtained.

As described above, by forming the first barrier layer 14a after an ammonia plasma treatment has been applied to the surface 14s, the first barrier layer 14a with excellent crystalline orientation property can be formed.

Figure 2C:
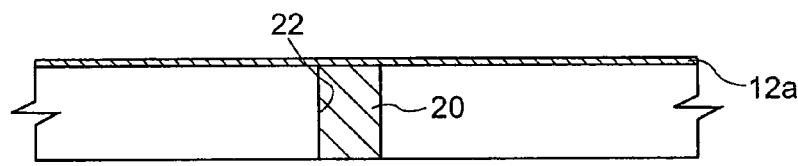

Next, as shown in FIG. 2C, the first barrier layer 14a is nitrided to thereby form a second crystalline barrier layer 12a composed of nitride. The first barrier layer 14a may be nitrided by any one of suitable methods selected according to the material of the first barrier layer 14a. For example, the first barrier layer 14a may be annealed in an atmosphere containing nitrogen to thereby nitride the first barrier layer 14a. It is noted that the annealing may preferably be conducted at temperatures less than the melting point of the first barrier layer 14a. By conducting the annealing in such a temperature range, nitrogen atoms can be introduced in gaps in the crystal lattice of the crystalline composing the first barrier layer 14a, in a state in which the crystalline orientation of the first barrier layer 14a is maintained. As a result, the second barrier layer 12a can be obtained. More concretely, the annealing may preferably be conducted between 350° C. and 650° C., and more preferably between 500° C. and 650° C.

For example, when the first barrier layer 14a includes titanium and aluminum (for example, TiAl), the second barrier layer 12a can be composed of nitride of titanium and aluminum (for example, TiAlN). When the first barrier layer 14a is composed of TiAl, the TiAl belongs to hexagonal crystal with a (001) orientation. Further, the second barrier layer 12a obtained through nitriding the first barrier layer 14a is composed of TiAlN (face-centered cubic crystal), and the TiAlN is influenced by the orientation of its raw material, TiAl (first barrier layer 14a), and becomes to have a (111) orientation.

As described above, when the ferroelectric film 34 is composed of PZT, and the content of titanium of the PZT is greater than the content of zirconium, the crystalline orientation of the PZT may preferably be in a (111) orientation because it has favorable hysteresis characteristics. Accordingly, by forming the crystalline orientation of the second barrier layer 12a in a (111) orientation, the first electrode 32a and the ferroelectric film 34a both can be made in a (111) orientation, such that the ferroelectric capacitor 30 with excellent hysteresis characteristics can be obtained.

Figure 2D:
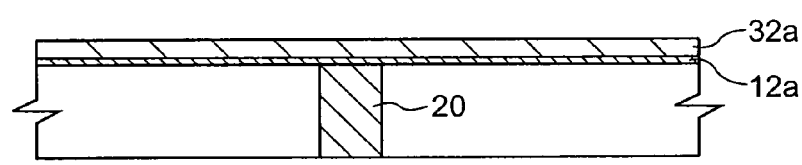

Next, as shown in FIG. 2D, a first electrode 32a is formed on the second barrier layer 12a. It is noted that, by forming the first electrode 32a on the second crystalline barrier layer 12a, the crystallinity of the first electrode 32a can be considerably improved, and the crystalline orientation property of the second barrier layer 12a can be reflected in the first electrode 32a. For example, when the crystalline orientation of the second barrier layer 12a is in a (111) orientation, at least a portion of the first electrode 32a can be formed in crystalline with a (111) orientation.

The first electrode 32a may be formed by any one of suitable film forming methods selected according to the material of the first electrode 32a, and may be formed by, for example, a sputter method or a CVD method.

Figure 2E:
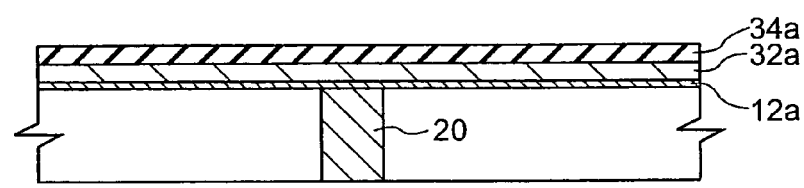

Then, as shown in FIG. 2E, a ferroelectric film 34a is formed on the first electrode 32a. It is noted that, by forming the ferroelectric film 34a on the first electrode 32a, the crystalline orientation property of the first electrode 32a can be reflected in the ferroelectric film 34a. For example, when at least a portion of the first electrode 32a is crystalline with a (111) orientation, the ferroelectric film 34a can be formed in a (111) orientation.

The ferroelectric film 34a may be formed by any one of suitable film forming methods selected according to the material of the ferroelectric film 34a, and may be formed by, for example, a spin-on method, a sputter method, and a MOCVD method.

Figure 2F:
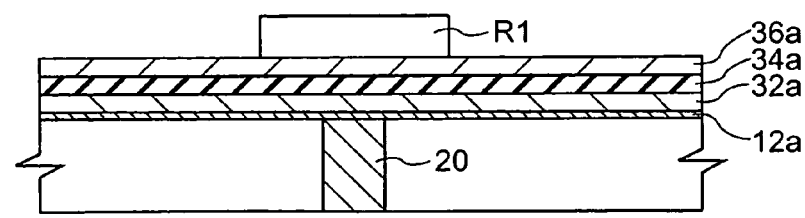

Next, as shown in FIG. 2F, a second electrode 36a is formed on the ferroelectric film 34a. The second electrode 36a may be formed by any one of suitable film forming methods selected according to the material of the second electrode 36a, and may be formed by, for example, a sputter method or a CVD method. Then, a resist layer R1 having a predetermined pattern is formed on the second electrode 36a, and patterning is conducted by a photolithography method with the resist layer R1 being used as a mask. As a result, a stacked type ferroelectric capacitor 30 having a first electrode 32 provided on a (second) barrier layer 12, a ferroelectric film 34 provided on the first electrode 32 and a second electrode 36 provided on the ferroelectric film 34 can be obtained (see FIG. 1).

As described above, according to the method for manufacturing the ferroelectric capacitor 30 in accordance with the embodiment of the invention, the first crystalline barrier layer 14a is nitrided to form the second crystalline barrier layer 12a composed of nitride, whereby the first electrode 32a and the ferroelectric film 34a that reflect the crystalline structure of the second barrier layer 12a can be formed. In other words, by forming the second barrier layer 12a having a specified crystalline orientation, the ferroelectric film 34a having a desired crystalline orientation can be formed. By this, the ferroelectric capacitor 30 with excellent hysteresis characteristics can be obtained.

According to the method for manufacturing the ferroelectric capacitor 30 in accordance with the embodiment of the invention, the first electrode 32a is formed above the second crystalline barrier layer 12a composed of nitride, whereby the first electrode 32a that does not reflect the crystalline structure of the lower layer can be formed by a relatively simple method.

3. Embodiment Examples

The invention is described below more concretely based on embodiment examples. However, it is noted that the invention is not limited to these embodiment examples.

3.1. Embodiment Examples 1 and 2

In the present embodiments, a transistor 18, a dielectric layer 26 and a plug 20 were formed, and then a second barrier layer 12a was formed on the plug 20 according to the steps indicated in FIGS. 1, 2A and 2B.

First, a transistor 18 was formed on a semiconductor substrate (silicon substrate) 10, and a dielectric layer 26 was laminated over the transistor 18. Then, an opening section 24 was formed in the dielectric layer 26, and the opening section 24 was embedded with tungsten by a CVD method. Then, the tungsten above the surface of the dielectric layer 26 was polished by chemical mechanical polishing, thereby forming a conductive layer 22. By the steps described above, a plug 20 was formed (see FIG. 1).

Next, a first barrier layer 14a containing titanium and aluminum (TiAl) was formed on the dielectric layer 26 and the plug 20 by a sputter method. In this film forming step, 100% argon gas was used as an atmosphere, and TiAl was selected as a target. It is noted that the ratio of titanium to aluminum in the target was set to Ti/Al=70:30 (atom ratio) in the case of Embodiment Example 1, and to Ti/Al=60:40 (atom ratio) in Embodiment Example 2.

Also, the first barrier layer 14a was formed under film forming conditions in which the flow amount of argon gas was 50 [sccm], the film forming power was 1.0 [kW], and the substrate temperature was set to four levels at 100[° C.], 200[° C.], 300[° C.] and 400[° C.]. Under these conditions, the first barrier layers 14a were formed.

Figure 3B:
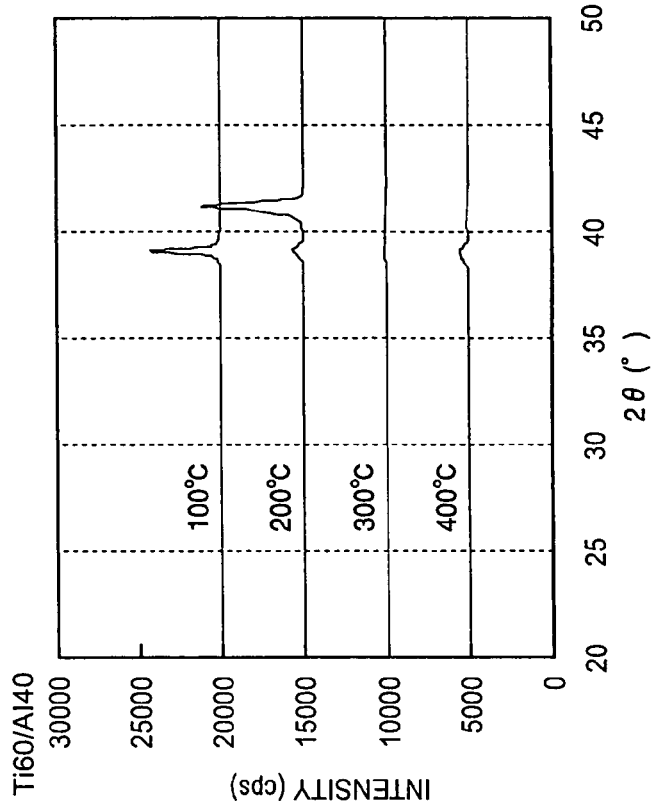
FIGS. 3A and 3B show XRD patterns of first barrier layers formed at different substrate temperatures in first and second embodiment examples, respectively.
Figure 3A:
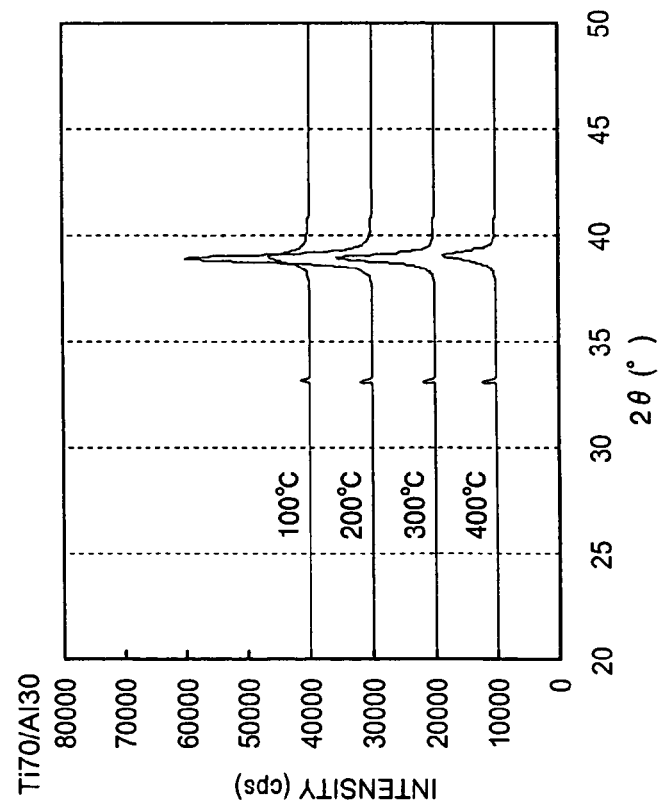

XRD (X-ray diffraction) patterns of the barrier layers 14a formed at different temperatures are shown in FIG. 3A and FIG. 3B. FIG. 3A shows the results of Embodiment Example 1, and FIG. 3B shows the results of Embodiment Example 2.

According to FIG. 3A and FIG. 3B, in the first barrier layers 14a obtained in both of Embodiment Example 1 and Embodiment Example 2, new peaks are observed near 2θ=37°. These peaks are assumed to indicate crystalline TiAl with a (111) orientation. Also, it is confirmed that the first barrier layers 14a obtained in Embodiment Example 1 excel in crystalline orientation property better than the first barrier layers 14a obtained in Embodiment Example 2. In particular, it is confirmed that, among the first barrier layers 14a obtained in Embodiment Example 1, the first barrier layer 14a formed with the substrate temperature at 200° C. had a higher degree of crystalline orientation property.

In light of the foregoing results, it becomes clear that, the greater the content of titanium in a target, the better the crystalline orientation property of the first barrier layer 14a becomes, and the first barrier layer 14a with an excellent (111) orientation property can be obtained when the composition of titanium and aluminum in a target is at Ti/Al=70:30 and the substrate temperature is 200° C.

3.2. Embodiment Example 3

In the present embodiment example (Embodiment Example 3), the first barrier layer 14a obtained in Embodiment Example 1 was annealed in a nitrogen atmosphere according to the step indicated in FIG. 2C, whereby a second barrier layer 12a composed of TiAlN was formed. The annealing in a nitrogen atmosphere was conducted by lamp anneal at 650° C. for two minutes in a nitrogen atmosphere.

Also, as a comparison example (Comparison Example 1), a barrier layer composed of TiAlN was formed by a reactive sputter method. The reactive sputter method was conducted under a condition in which the flow amount of argon gas was 50 [sccm], the film forming power was 1.0 [kW], and the substrate temperature was 400[° C.].

Figures 4A, 4B:
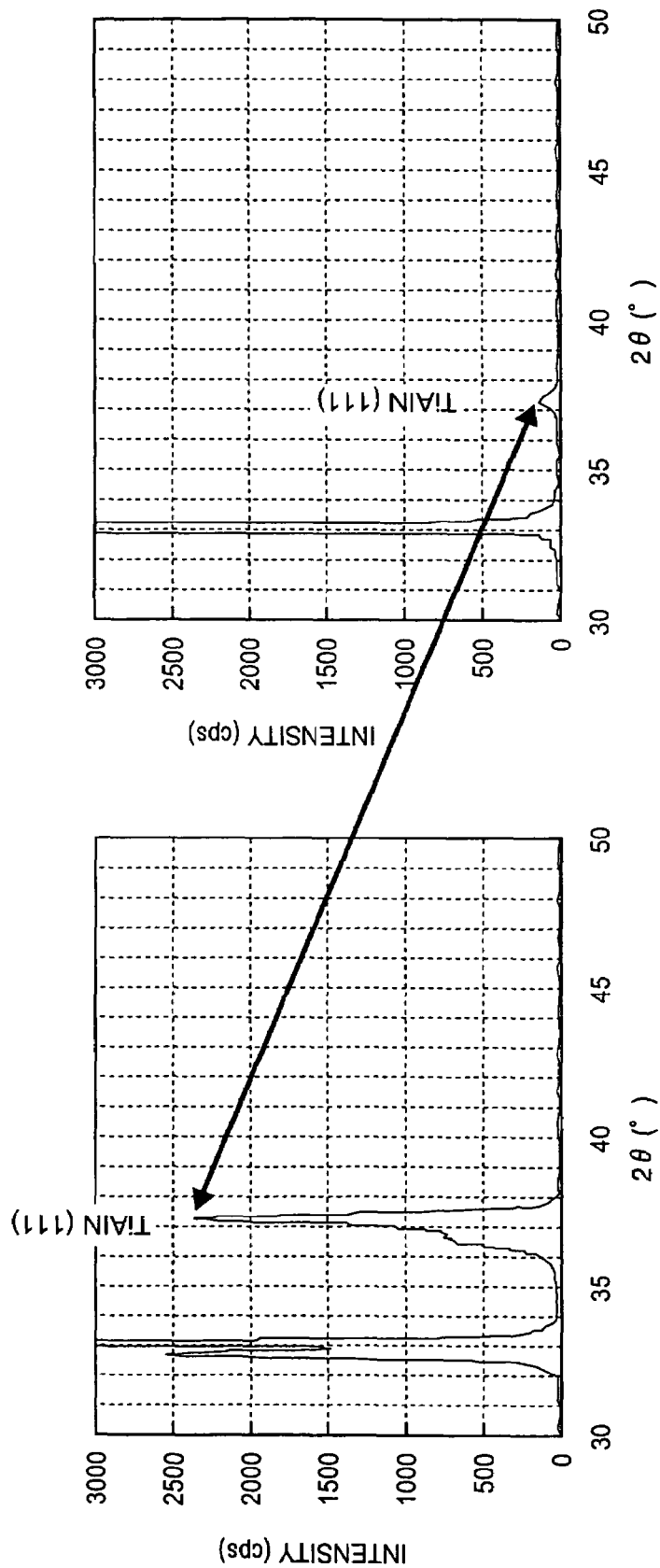
FIGS. 4A and 4B show XRD patterns of (second) barrier layers formed at different substrate temperatures in a third embodiment example and a first comparison example, respectively.

XRD (X-ray diffraction) patterns of the second barrier layers 12a formed in the present embodiment example (Embodiment Example 3) and Comparison Example 1 are shown in FIG. 4A and FIG. 4B. It is noted that peaks observed near 2θ=33° C. in FIG. 4A and FIG. 4B indicate Si of the substrate 10.

According to FIG. 4A, in the second barrier layer 12a obtained in the present embodiment example (Embodiment Example 3), a peak is observed near 2θ=37° C. This peak is assumed to indicate crystalline TiAl with a (111) orientation. On the other hand, in the barrier layer obtained in Comparison Example 1, a peak is observed near 2θ=37° C., but the height of the peak observed in Comparison Example 1 is substantially lower than that of the second barrier layer obtained in the present embodiment example (Embodiment Example 3).

In light of the foregoing results, it is confirmed that, by nitriding the first barrier layer 14a, in accordance with the present embodiment example, the second barrier layer 12a composed of TiAlN with a (111) orientation can be obtained.

The embodiments of the invention are described above in detail. However, those skilled in the art should readily understand that many modifications can be made without departing in substance from the novel matter and effects of the invention. Accordingly, those modified examples are also included in the scope of the invention.

For example, the ferroelectric capacitors and the methods for manufacturing the same in accordance with the embodiments of the invention are applicable to, for example, capacitors included in piezoelectric elements and the like.

What is claimed is:

1. A method for manufacturing a ferroelectric capacitor, the method comprising the steps of:
   (a) forming a first crystalline barrier layer;
   (b) forming a second crystalline barrier layer composed of nitride by nitriding the first crystalline barrier layer;
   (c) forming a first electrode above the second crystalline barrier layer;
   (d) forming a ferroelectric film on the first electrode; and
   (e) forming a second electrode on the ferroelectric film,
   wherein, in the step (b), the first crystalline barrier layer is annealed in an atmosphere containing nitrogen, thereby nitriding the first crystalline barrier layer, and the annealing is conducted at about 350° C. to 650° C.

2. A method for manufacturing a ferroelectric capacitor according to claim 1, wherein, in the step (a), the first crystalline barrier layer is formed on a plug.

3. A method for manufacturing a ferroelectric capacitor according to claim 1, wherein the first crystalline barrier layer includes titanium and aluminum, and the second crystalline barrier layer is composed of nitride of titanium and aluminum.

4. A method for manufacturing a ferroelectric capacitor according to claim 3, wherein the first crystalline barrier layer includes, as a constituent element thereof, titanium by 70 atom % or more.

5. A method for manufacturing a ferroelectric capacitor according to claim 1 further comprising, prior to the step (a), the step (f) of exciting plasma of ammonia gas and irradiating the plasma to a surface of the layer on which the first crystalline barrier layer is to be formed.

6. A ferroelectric memory device comprising:
a switching transistor;
a plug that is electrically connected to the switching transistor; and
a ferroelectric capacitor provided on the plug, wherein the ferroelectric capacitor includes a first electrode provided on a crystalline barrier layer composed of nitride, a ferroelectric film provided on the first electrode, and a second electrode provided on the ferroelectric film,
wherein the crystalline barrier layer is annealed in an atmosphere containing nitrogen, thereby nitriding the first crystalline barrier layer, and the annealing is conducted at about 350° C. to 650° C.

* * * * *